(12) United States Patent
Chung

(10) Patent No.: US 8,290,182 B2
(45) Date of Patent: Oct. 16, 2012

(54) METHOD OF USING AN APPARATUS TO AUTOMATICALLY CONTROL SUDDEN CHANGES IN VOLUME

(75) Inventor: Chi-ho Chung, Seoul (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 802 days.

(21) Appl. No.: 12/342,149

(22) Filed: Dec. 23, 2008

(65) Prior Publication Data

US 2009/0190779 A1 Jul. 30, 2009

(30) Foreign Application Priority Data

Jan. 29, 2008 (KR) .................. 10-2008-0009005

(51) Int. Cl.
*H03G 3/00* (2006.01)

(52) U.S. Cl. ........ 381/107; 381/106; 381/108; 381/109; 700/94

(58) Field of Classification Search .............. 700/94; 381/106–109
See application file for complete search history.

(56) References Cited

U.S. PATENT DOCUMENTS 6,907,129 B2    6/2005   Mallinson

FOREIGN PATENT DOCUMENTS

EP    1835487    9/2007

*Primary Examiner* — Evan Pert
*Assistant Examiner* — Mark A Laurenzi
(74) *Attorney, Agent, or Firm* — Stanzione & Kim, LLP

(57) ABSTRACT

A method includes comparing a magnitude value of an audio signal in a fixed unit section with a target volume level, measuring audio gain in each fixed unit section using specific functions which are each determined to be different according to a ratio of the target volume level to the audio signal magnitude, and providing the measured audio gain to the audio signal in the fixed unit section.

9 Claims, 5 Drawing Sheets

METHOD OF USING AN APPARATUS TO AUTOMATICALLY CONTROL SUDDEN CHANGES IN VOLUME

CROSS-REFERENCE TO RELATED APPLICATIONS

This application claims priority under 35 U.S.C. §119(a) from Korean Patent Application No. 10-2008-0009005, filed on Jan. 29, 2008, in the Korean Intellectual Property Office, the disclosure of which is incorporated herein in its entirety by reference.

BACKGROUND OF THE INVENTION

1. Field of the Invention

The present general inventive concept relates to an audio reproduction system, and more particularly, to a method and apparatus to automatically control audio volume that suddenly changes between channels or scenes.

2. Description of the Related Art

Currently, due to a rapid development of communication and broadcasting technologies and combining of communication and broadcasting fields, a service for conveniently watching digital broadcasting while moving is provided.

In general, audio and video (AV) reproduction devices such as digital televisions (DTVs) or home theaters allow viewers to watch TV or video of a personal video recorder (PVR) by connecting to various external devices and selecting various types of signals and broadcast channels for watching terrestrial analog broadcasting, satellite broadcasting, and cable broadcasting.

In conventional DTVs or home theaters, when a user changes a channel or a scene is changed, an audio volume level suddenly changes and thus the user feels uncomfortable.

For example, a user individually changes channels of DTVs to identify a condition of a screen. The DTVs automatically and sequentially search for broadcast channels of received frequency bands.

However, while changing channels, a user feels that volume levels of each broadcast channel are slightly different which occurs due to a receive sensitivity of each broadcast channel. Accordingly, such a volume change due to changing channels should be corrected.

Thus, in conventional AV reproduction devices, a method of controlling audio volume using a linear curve is used to correct a volume change occurring due to the changing of channels or scenes.

FIGS. 1A and 1B are graphs illustrating a relationship between magnitudes of input audio signals and output audio signals used in the conventional method of controlling audio volume.

Referring to FIG. 1A, the conventional method of controlling audio volume defines a volume controlling section as three sections such as a boost section 110, a no modification section 120, and a cut section 130.

For example, when a volume of the audio signal is above an optimum level (cut section 130), a gain of the audio signal decreases. When the volume of the audio signal is at an optimum level (no modification section 120), the gain of the audio signal is maintained. When the volume of the audio signal is below an optimum level (boost section 110), the gain of the audio signal increases.

However, as illustrated in FIG. 1B, the volume cannot be controlled in a center portion 150 of the no modification section 120 and sound deterioration occurs due to discontinuous control in a first boundary portion 140 of the boost section 110 and the no modification section 120 and a second boundary portion 160 of the cut section 130 and the no modification section 120.

SUMMARY OF THE INVENTION

The present general inventive concept provides a method and apparatus to control audio volume, to automatically normalize a volume that suddenly changes between channels or scenes, by obtaining a gain of an audio signal that is appropriate for each frame using exponential function input/output curves and active section allocation.

Additional aspects and utilities of the present general inventive concept will be set forth in part in the description which follows and, in part, will be obvious from the description, or may be learned by practice of the general inventive concept.

The foregoing and/or other aspects and utilities of the general inventive concept may be achieved by providing a method of automatically controlling audio volume, the method including comparing a magnitude value of an audio signal in a fixed unit section with a target volume level, measuring an audio gain in each fixed unit section using specific functions which are each determined to be different according to a ratio of the target volume level to the audio signal magnitude, and providing the measured audio gain to the audio signal in the fixed unit section.

The foregoing and/or other aspects and utilities of the general inventive concept may also be achieved by providing an apparatus to automatically control audio volume, the apparatus including a frame power calculating unit to calculate a power value of an input audio signal for each fixed section unit, a volume controller to compare a magnitude of an audio signal calculated in the frame power calculating unit with a determined target volume level and to measure an audio gain using specific functions which are each determined to be different according to a ratio of the magnitude value of the audio signal to the target volume level, and an output buffer unit to output an audio signal to which the audio gain measured in the volume controller is applied.

The foregoing and/or other aspects and utilities of the general inventive concept may also be achieved by providing an audio reproduction system including an audio volume controller to compare a magnitude of an audio signal in a fixed time unit with a target volume level and to control audio volume by an audio gain using exponential functions that are each different according to a ratio of the magnitude of the audio signal to the target volume level, and an amplifier unit to amplify the audio signal output from the audio volume controller to a predetermined magnitude.

The foregoing and/or other aspects and utilities of the general inventive concept may also be achieved by providing an apparatus to control audio volume, the apparatus including a volume controller to apply predetermined exponential functions to obtain a respective gain corresponding to each of a plurality of fixed unit sections, wherein the volume controller automatically normalizes a volume to prevent the volume from sudden changes between channels or scenes.

The volume controller may compare a magnitude value of an audio signal and a target volume level such that the respective gain of the audio signal is changed by controlling an exponential value of the respective exponential function based on the comparison.

The respective gain of the audio signal may be decreased when the magnitude value of the audio signal is larger than the target volume and the respective gain of the audio signal may be when the magnitude value of the audio signal is smaller than the target volume.

The volume controller may control the volume of an audio signal according to a boost section, a no modification section, and a cut section, and controls the volume of the audio signal according to the gain corresponding to a boundary between the no-modification section and at least one of the boost section and the cut section.

BRIEF DESCRIPTION OF THE DRAWINGS

These and/or other aspects and utilities of the present general inventive concept will become apparent and more readily appreciated from the following description of the embodiments, taken in conjunction with the accompanying drawings of which.

DETAILED DESCRIPTION OF THE PREFERRED EMBODIMENTS

Figure 1A:
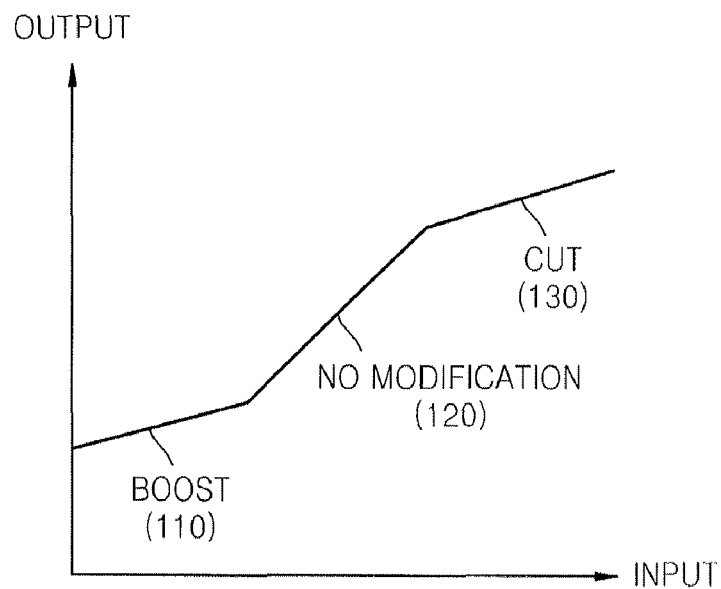
FIGS. 1A and 1B are graphs illustrating a relationship between magnitudes of input audio signals and output audio signals used in a conventional method of controlling audio volume.
Figure 1B:
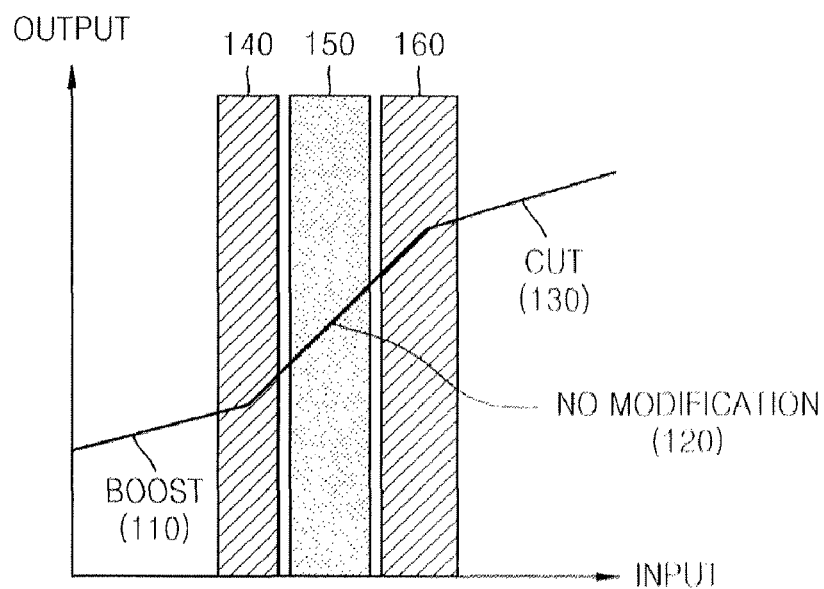

Reference will now be made in detail to embodiments of the present general inventive concept, examples of which are illustrated in the accompanying drawings, wherein like reference numerals refer to the like elements throughout. The embodiments are described below in order to explain the present general inventive concept by referring to the figures.

Figure 2:
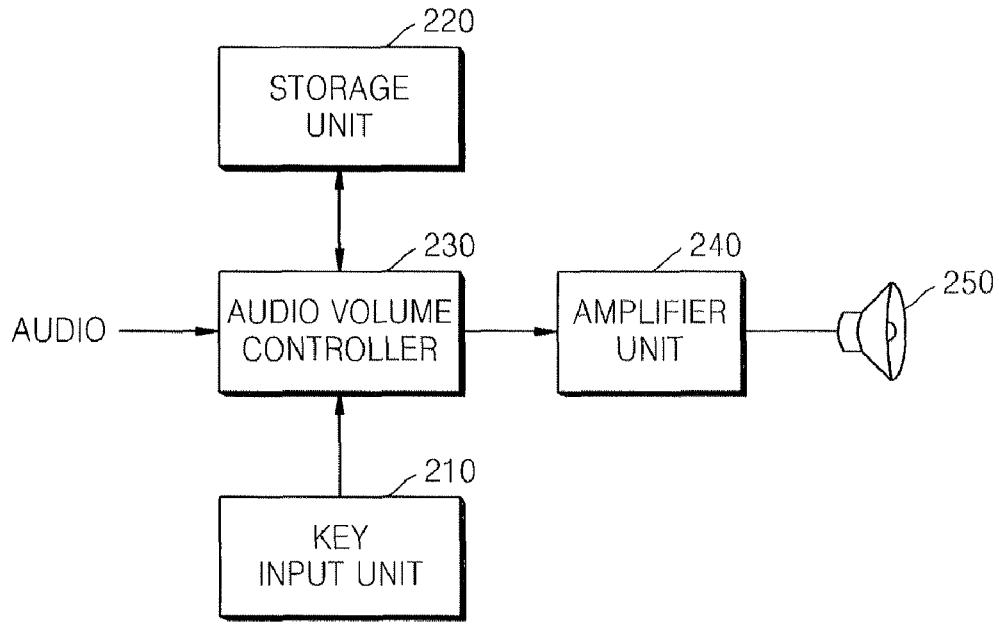
FIG. 2 is a block diagram illustrating an audio reproduction system according to an embodiment of the present general inventive concept.

FIG. 2 is a block diagram illustrating an audio reproduction system according to an embodiment of the present general inventive concept.

The audio reproduction system includes a key input unit 210, a storage unit 220, an audio volume controller 230, an amplifier unit 240, and a speaker unit 250.

The key input unit 210 is formed of a keypad or a touch screen and includes a plurality of number/letter input keys to select various function operations and function keys to interface with a user.

The storage unit 220 is formed of a Read Only Memory (ROM) and/or a voice memory to store various programs and data, such as a target volume level determined by a user and a look-up table.

The audio volume controller 230 compares a magnitude of an audio signal in a time unit (for example, a frame, a predetermined time unit or a fixed time unit) with the target volume level and controls an audio volume using exponential functions that are each different according to a ratio of the target volume level to the audio signal magnitude.

The amplifier unit 240 amplifies the audio signal output from the audio volume controller 230 so as to increase the magnitude of the signal that is to be reproduced by a speaker.

The speaker unit 250 reproduces the audio signal amplified by the amplifier unit 240 to a sound in an audio frequency band.

Figure 3:
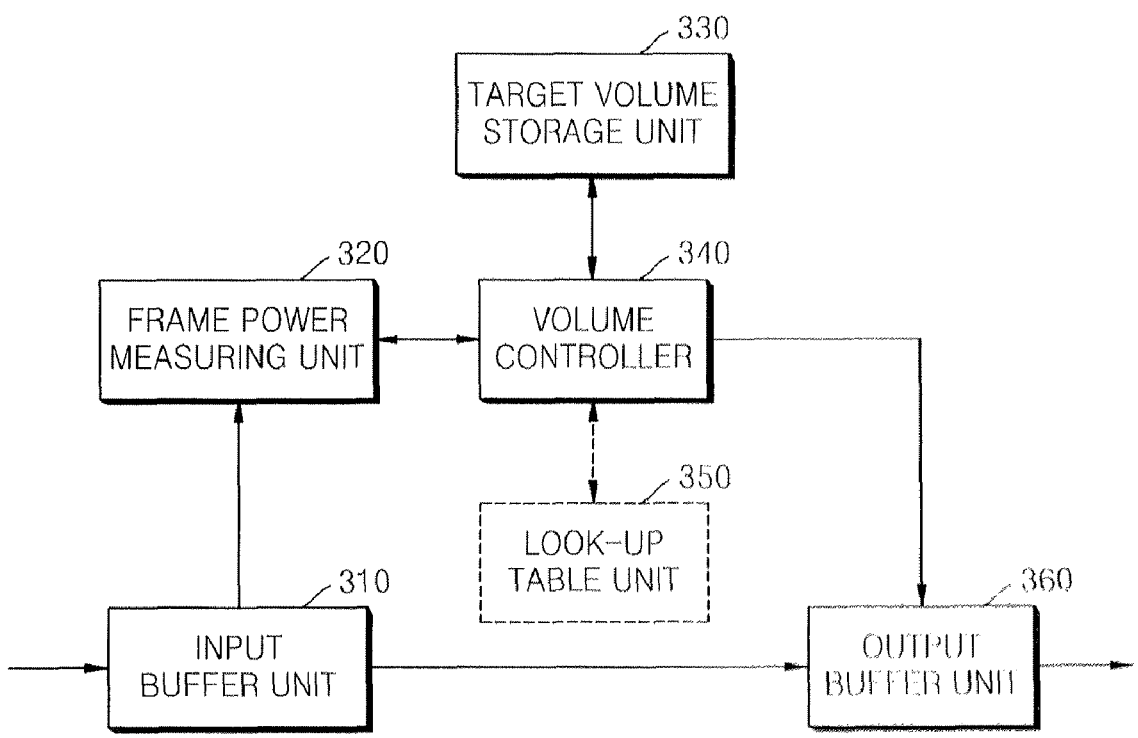
FIG. 3 is a block diagram illustrating an audio volume controller of FIG. 2 in more detail.

FIG. 3 is a block diagram illustrating the audio volume controller 230 of FIG. 2 in more detail.

The audio volume controller 230 includes an input buffer unit 310, a frame power measuring unit 320, a target volume storage unit 330, a look-up table unit 350, a volume controller 340, and an output buffer unit 360.

The input buffer unit 310 buffers an input audio signal in a pulse code modulation (PCM) form.

The frame power measuring unit 320 measures a power value (or a magnitude value) of the audio signal stored in the input buffer unit 310 for each fixed section. For example, the frame power measuring unit 320 divides the input audio signal into frame units, applies a window function to each frame, and measures the power value of the audio signal corresponding to a root mean square (RMS) for each frame unit. Here, a windowing method generally uses a Hamming window and a Hanning window.

The target volume storage unit 330 stores the target volume level arbitrarily set by a user.

The volume controller 340 compares the power value of the audio signal measured in the frame power measuring unit 320 and the target volume level stored in the target volume storage unit 330 and applies exponential functions previously determined according to a ratio of the target volume level to the audio signal magnitude to the input audio volume, so as to obtain an audio gain for each fixed unit section.

Here, the volume controller 340 uses the look-up table unit 350 or an exponential operation performed by a processor to obtain the gain.

The look-up table unit 350 stores the gains of the audio signal that are each different and are optimally determined according to a ratio of the power value of the audio signal to the target volume level, in a look-up table form.

The output buffer unit 360 outputs the audio signal in which the audio gain generated from the volume controller 340 is applied to the audio signal output from the input buffer unit 310.

Figure 4:
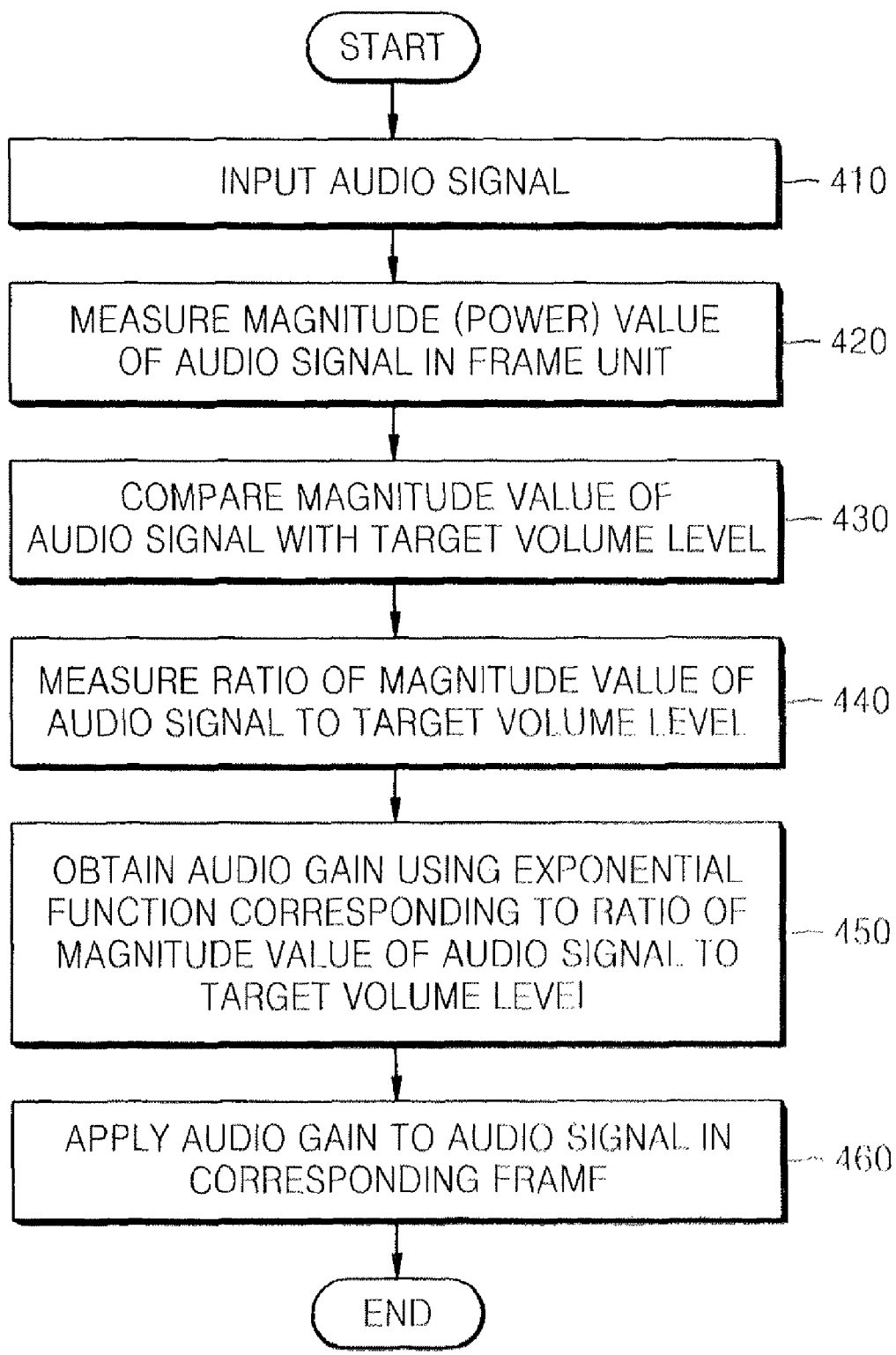
FIG. 4 is a flowchart illustrating a method of automatically controlling audio volume according to an embodiment of the present general inventive concept.

FIG. 4 is a flowchart illustrating a method of automatically controlling audio volume according to an embodiment of the present general inventive concept.

Firstly, the audio signal in a PCM form is input in operation 410.

Then, the input audio signal is divided into the frame units and the power value of the audio signal corresponding to the RMS value is measured for each frame unit in operation 420.

In operation 430, the power value of the audio signal is compared with the target volume level arbitrarily determined by the user.

In operation 440, the ratio of the power value of the input audio signal to the target volume level is measured.

Then, the exponential functions differently determined according to the ratios of the magnitude of the audio signal, compared with the target volume level are applied to the ratio of the magnitude of the input audio signal to the target volume and the audio gain for each fixed unit section is obtained in operation 450.

Here, the ratios of the magnitude of the audio signal to the target volume level are classified into a plurality of ranges and the exponential function included in the corresponding range is applied to the ratio of the magnitude of the input audio signal to the target volume.

For example, assuming that the magnitude value of the input audio signal is x, the target volume is c, and the ratio x/c of the magnitude of the input audio signal to the target volume is classified into five cases as follows.

(1) x/c<0.01 (when x/c is below 1%)
(2) 0.01<x/c<0.1 (when x/c is between 1% and 10%)
(3) 0.1<x/c<2 (when x/c is between 10%-200%)
(4) 2<x/c<10 (when x/c is between 200%-1000%)
(5) 10<x/c (when x/c is above 1000%)

Here, people recognize the sound by a log scale so that the gain of the audio signal can be realized by the exponential function.

Accordingly, the audio gains for each frame are obtained using the ratio of the power value of the audio signal to the target volume, in which the exponential functions that are different according to the magnitude value of the audio signal, compared with the target volume. Each different exponential function having continuous characteristics according to the ratio of the magnitude value of the audio signal to the target volume are set in each case.

For example, when (1) x/c<0.01, the gain g1 is $(x/c)^{0.6}$, when (2) 0.01<x/c<0.1, the gain g2 is $(x/c)^{0.8}$, when 3) 0.1<x/c<2, the gain g3 is $(x/c)^{1.2}$, when (4) 2<x/c<10, the gain g4 is $(x/c)^{1.4}$, and when (5) 10<x/c, the gain g5 is $(x/c)^{1.8}$.

That is, when the magnitude value of the input audio signal is larger than the target volume, the gain of the audio signal should be decreased by controlling the exponential value of the exponential function. When the magnitude value of the input audio signal is smaller than the target volume, the gain of the audio signal should be increased by controlling the exponential value of the exponential function.

Here, a method of extracting the gain of the audio signal may include directly measuring the exponential function performed by the processor and using the look-up table in which the gain of the audio signal previously determined is stored. Here, the look-up table stores the gains of the audio signal to which the exponential functions that are each different according to the ratio of the magnitude value of the audio signal to the target volume are applied.

Then, the gains of the audio signal obtained by each fixed unit section are applied to the audio signals input by each fixed unit section in operation 460. For example, when the exponential value is α, the output signal (y) may be represented by $(x/c)^{\alpha} x x$.

Figure 5:
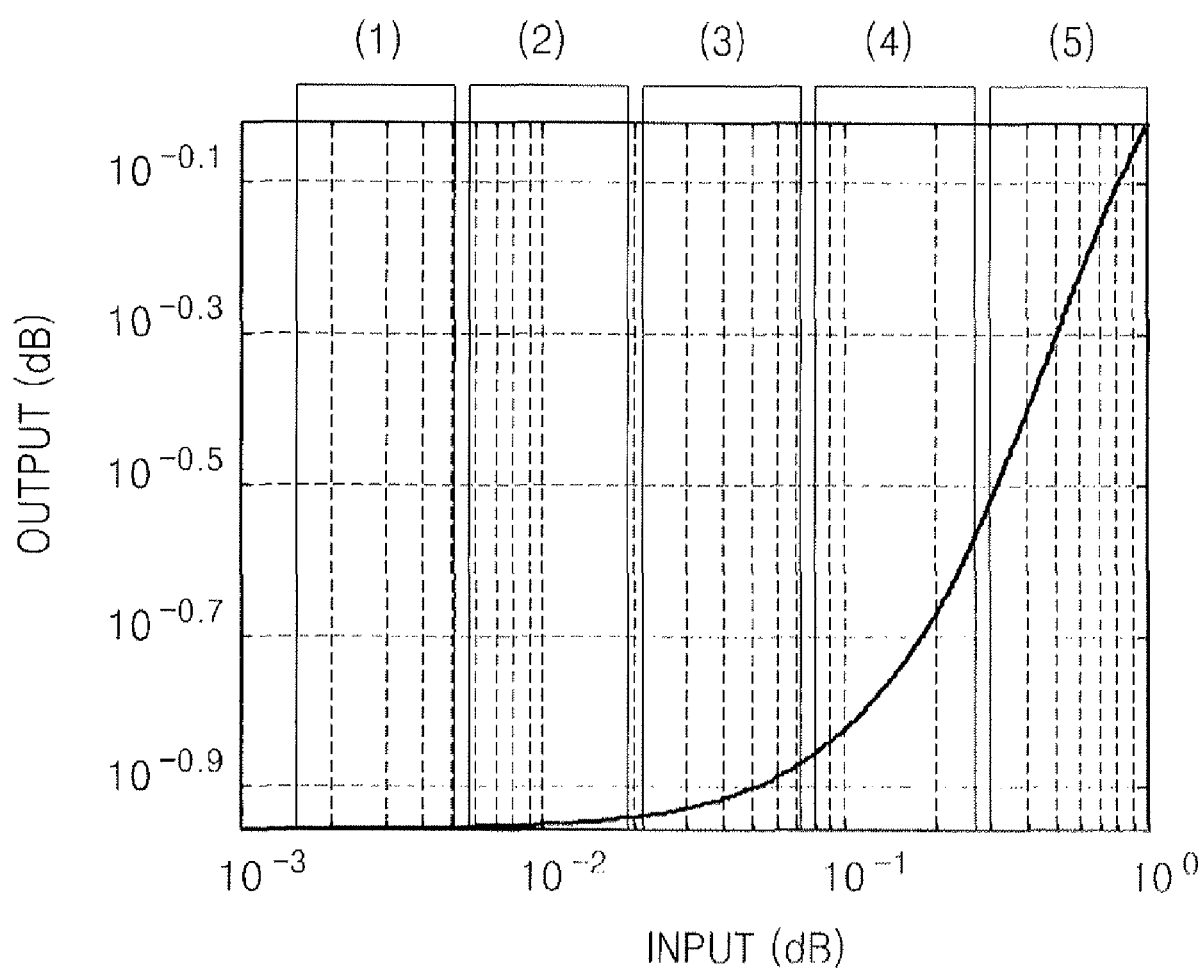
FIG. 5 is a graph illustrating an input/output function indicating a relationship between magnitudes of input audio signals and output audio signals according to an embodiment of the present general inventive concept.

FIG. 5 is a graph illustrating an input/output function indicating a relationship between magnitudes of input audio signals and output audio signals according to an embodiment of the present general inventive concept.

Referring to FIG. 5, people recognize sound according to a log scale so that the gain of the audio signal can be realized by the exponential function.

Accordingly, the ratio of the magnitude value of the audio signal to the target volume is divided into, for example, five cases (1) to (5), and each different exponential function in which an auditory characteristic is reflected is applied to each case.

In addition, continuous exponential functions are applied to each case in order for discontinuous volume not to occur.

Figure 6A:
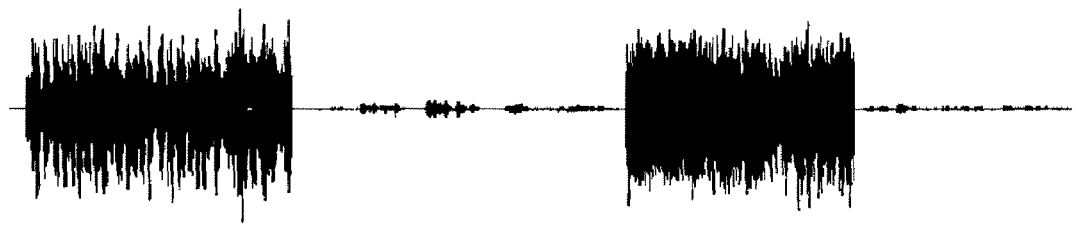
FIGS. 6A through 6C respectively illustrate a waveform of an original signal, a waveform of a signal planarized by using a conventional technology, and a waveform of a signal planarized by using a technology according to an embodiment of the present general inventive concept with respect to a sudden volume change between channels/scenes.
Figure 6B:
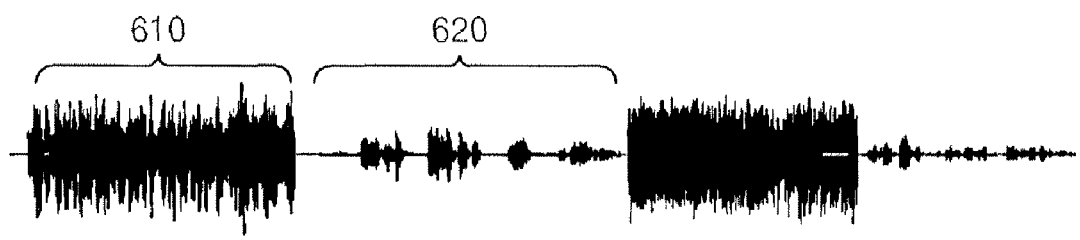
Figure 6C:
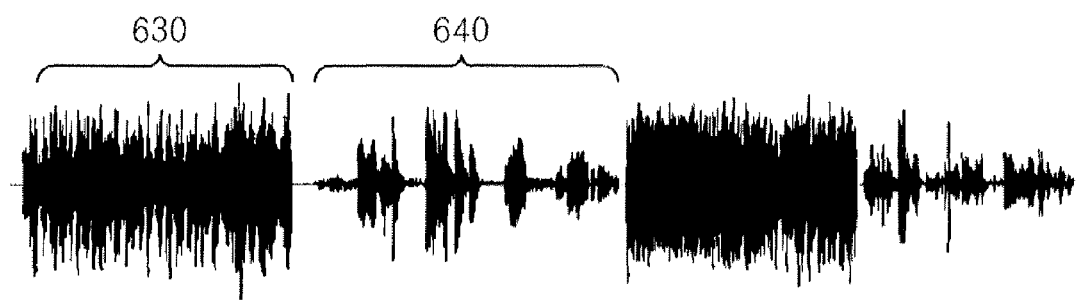

FIGS. 6A through 6C illustrate a signal planarized from an original signal by using a conventional technology and a signal planarized from an original signal by using a technology according to an embodiment of the present general inventive concept with respect to a sudden volume change between channels/scenes.

FIG. 6A illustrates a waveform of an original signal having a sudden volume change between channels/scenes.

FIG. 6B illustrates a waveform of a signal planarized using a conventional technology with respect to a sudden volume change between channels/scenes.

Referring to FIG. 6B, a planarization degree of signals 610 and 620 having a sudden volume change between channels/scenes is weak.

FIG. 6C illustrates a waveform of a signal planarized using a technology according to an embodiment of the present general inventive concept with respect to a sudden volume change between channels/scenes.

Referring to FIG. 6C, the planarization degree of signals 630 and 640 having a sudden volume change between channels/scenes is high.

As described above, according to various embodiment of the present general inventive concept, the gain of an audio signal that is appropriate for each frame is obtained using an exponential function input/output curve in which an auditory characteristic is reflected so that inconveniences occurring due to a volume difference between the channels/scenes, a signal level difference in the audio signals between multimedia applications, the volume difference between various media files according to an encoded signal level difference can be resolved. Thus, the method and apparatus to automatically control audio volume according to various embodiments of the present general inventive concept can be efficiently applied to DTVs, home theater, MP3 reproduction devices, mobile AV devices, and laptop PCs so as to increase performances thereof.

The present general inventive concept can also be embodied as computer-readable codes on a computer-readable recording medium. The computer-readable medium can include a computer-readable recording medium and a computer-readable transmission medium. The computer-readable recording medium is any data storage device that can store data which can be thereafter read by a computer system. Examples of the computer-readable recording medium include read-only-memory (ROM), random-access memory (RAM), CD-ROMs, magnetic tapes, floppy disks, and optical data storage devices. The computer-readable recording medium can also be distributed over network coupled computer systems so that the computer-readable code is stored and executed in a distributed fashion. The computer-readable transmission medium can transmit carrier waves or signals (e.g., wired or wireless data transmission through the Internet). Also, functional programs, codes, and code segments to accomplish the present general inventive concept can be easily construed by programmers skilled in the art to which the present general inventive concept pertains.

While the present general inventive concept has been particularly illustrated and described with reference to exemplary embodiments thereof, it will be understood by those of ordinary skill in the art that various changes in form and details may be made therein without departing from the spirit and scope of the present general inventive concept as defined by the following claims.

What is claimed is:

1. A method of automatically controlling audio volume, the method comprising:
    comparing a magnitude value of an audio signal in a fixed unit section with a target volume level;
    measuring an audio gain in each fixed unit section using specific functions which are each determined to be different with regard to a ratio of the target volume level to the audio signal magnitude; and providing the measured audio gain to the audio signal in the fixed unit section.

2. The method of claim 1, wherein measuring the audio gain comprises:

classifying the ratio of the magnitude value of the audio signal to the target volume level into a plurality of cases and applying a plurality of functions allocated to a case in which a ratio of the magnitude value of the audio signal to the target volume level is included, to the ratio of the magnitude value of the audio signal to the target volume level.

3. The method of claim 2, wherein the plurality of functions are each set differently according to the ratio of the magnitude value of the audio signal to the target volume level.

4. The method of claim 1, wherein the target volume level is determined arbitrarily by a user.

5. The method of claim 1, wherein the plurality of functions are exponential functions in which an auditory characteristic is reflected.

6. The method of claim 1, wherein the measuring of the audio gain comprises:

applying an exponential function curve having a continuous characteristic to the ratio of the magnitude value of the audio signal to the target volume level.

7. The method of claim 1, wherein the audio gain in each fixed unit section to which a specific function is applied according to the ratio of the magnitude value of the audio signal to the target volume level is stored in a look-up table.

8. The method of claim 1, wherein the audio gain in each fixed unit section is measured by applying the determined exponential function to the ratio of the magnitude value of the audio signal to the target volume level.

9. A computer-readable recording medium having embodied thereon a computer program to execute a method, the method comprising:

comparing a magnitude value of an audio signal in a fixed unit section with a target volume level;

measuring audio gain in each fixed unit section using specific functions which are each determined to be different with regard to a ratio of target volume level to the audio signal magnitude; and providing the measured audio gain to the audio signal in the fixed unit section.

* * * * *